United States Patent [19]

Hall et al.

[11] Patent Number: 5,566,261
[45] Date of Patent: Oct. 15, 1996

[54] OPTICAL MEMORY AND DATA PATTERN GENERATOR

[75] Inventors: Katherine L. Hall, Westford; John D. Moores, Concord; Kristin A. Rauschenbach, Marlboro, all of Mass.

[73] Assignee: Massachusetts Institute of Technology, Cambridge, Mass.

[21] Appl. No.: 450,786

[22] Filed: May 25, 1995

[51] Int. Cl.$^6$ .................................................. G02B 6/27
[52] U.S. Cl. ............................ 385/27; 356/350; 372/21; 372/94; 385/11; 385/24; 385/122
[58] Field of Search ................................... 356/349, 350; 372/21, 22, 94; 385/5, 11, 15, 24, 27, 39, 122

[56] References Cited

U.S. PATENT DOCUMENTS

| | | | |
|---|---|---|---|
| 4,229,106 | 10/1980 | Dorschner et al. | 356/350 |
| 4,429,393 | 1/1984 | Giuliano | 372/21 |
| 4,473,270 | 9/1984 | Shaw | 385/30 |
| 4,479,701 | 10/1984 | Newton et al. | 385/24 |
| 4,653,042 | 3/1987 | d'Auria et al. | 359/124 |
| 4,708,421 | 11/1987 | Desurvire et al. | 385/30 |
| 4,738,503 | 4/1988 | Desurvire et al. | 385/30 |
| 4,815,804 | 3/1989 | Desurvire et al. | 385/27 |
| 4,856,862 | 8/1989 | Passmore et al. | 359/127 |
| 4,923,267 | 5/1990 | Su | 385/16 |
| 5,119,383 | 6/1992 | Duling, III et al. | 372/21 X |
| 5,331,403 | 7/1994 | Rosker et al. | 356/350 |
| 5,349,601 | 9/1994 | Hohimer et al. | 372/94 |

OTHER PUBLICATIONS

A. Behfar-Rad et al., "AlGaAs/GaAs-Based Triangular-Shaped Ring Ridge Lasers" *Appl. Phys. Lett.* 60(14):1658–1660 (1992)(Apr.).

C. R. Doerr et al., "Additive-Pulse Mode-Locking/Limiting Storage Ring" *Optics Letters* 19(21):1747–1749 (1994)(Nov.).

K. L. Hall et al., "All-Optical Storage of a 1.25 kbit Packet at 10 Gb/s" Presentation for CLEO '95 held May 25, 1995, 12 pp.

H. A. Haus et al., "Additive-Pulse Modelocking in Fiber Lasers" *IEEE Journal of Quantum Electronics* 30(1):200–208 (1994)(Jan.).

John D. Moores et al., "Stability and Timing Maintenance in Soliton Transmission and Storage Rings" *Optics Communications* 113:153–175 (1994)(Dec.).

V. I. Belotitskii et al., "Demonstration of Over 100 Million Round Trips in Recirculating Fibre Loop with All-Optical Regeneration" *Electronics Letters* 29:49–50 (1993)(Jan.).

H. Avramopoulos et al., "Addressable Fiber-Loop Memory" *Optics Letters* 18(1):22–24 (1993)(Jan.).

G. Bendelli et al., "Photonic ATM Switch Based on a Multiwavelength Fiber-Loop Buffer" *OFC '95 Technical Digest* 141–142 (1995) (Month not avail.).

Yoshiaki Yamada et al., "FDM Optical-Loop Buffer and Its Applications to a Photonic ATM Switch: FrontierNet" *OFC '95 Technical Digest* 140 (1995) (Month not avail.).

Antonio Mecozzi et al., "Long-Term Storage of a Soliton Bit Stream by Use of Phase-Sensitive Amplification" *Optics Letters* 19(24):2050–2052 (1994) (Dec.).

*Primary Examiner*—John D. Lee
*Attorney, Agent, or Firm*—Testa, Hurwitz & Thibeault, LLP

[57] ABSTRACT

An optical memory and an optical random and pseudo-random pattern generator for ultra-high-speed time-domain multiplexing multi-access networks are described. The optical memory and pattern generators include an optical ring resonator, an optical amplifier, a bistability generator, an optically-controlled stabilizing element, and a coupling element. Such devices are capable of storing high data rates for long periods of time.

40 Claims, 5 Drawing Sheets

OPTICAL MEMORY AND DATA PATTERN GENERATOR

GOVERNMENT SUPPORT

This invention was made with government support under Contract Number MDA-972-92-J-1083 awarded by the Advanced Research Projects Administration. The government has certain rights in the invention.

FIELD OF THE INVENTION

The invention relates generally to the field of optical storage and optical pulse pattern generation. In particular, the invention relates to optical memories, buffers, and signal generating devices which are useful for optical processing and optical switching systems, and to methods of optical data storage and pattern generation.

BACKGROUND OF THE INVENTION

Optical memories and optical random and pseudo-random pattern generators are important components for optical communication and computing systems such as ultra-high-speed, time-domain, multiplexing, multi-access optical networks. Such devices are useful for performing a variety of functions, including storing data packets during dock recovery, processing of headers, and data rate conversions. Also, optical memory is required for bandwidth-on-demand systems while users wait for access to the network.

Short-term optical data storage has been demonstrated in optical memories. For example, U.S. Pat. No. 4,473,270 discloses an optical circulating loop useful for a short-term optical memory. Data is loaded into the circulating loop and is preserved during multiple circulations in the loop. The data signals are readable until they are attenuated. Because there is no amplification in the loop to compensate for loss, the data signals rapidly attenuate.

U.S. Pat. Nos. 4,738,503 and 4,923,267 disclose an optical circulating loop which includes an amplifier to partially compensate for losses in the loop. The amplifier, however, must operate with a net round trip loss, otherwise noise can build to a large steady-state value. In addition, laser oscillation will occur and destroy the data pattern.

Researchers have discovered that lossless circulation in an optical circulating loop can be achieved by incorporating bistability in the circulating path. J. D. Moores, "On the Ginzburg-Landau Laser Modelocking Model with Fifth Order Saturable Absorber Term," Opt. Comm., vol. 96, pp 65–70, February 1993, H. A. Haus, E. P. Ippen, and K. Tamura, "Additive Pulse Modelocking In Fiber Lasers," *IEEE J. Quant.* Elec., vol 30 pp. 200–208, January 1994. Bistability introduces different round trip losses for high intensity and low intensity signals. Thus, the bistability amplifies and maintains optical pulses with higher energy and attenuates optical pulses with lower energy.

Storage time in circulating loops having lossless circulation is restricted by propagation limitations. Mechanisms which contribute to propagation imitations include the Gordon-Haus effect, Raman self-frequency shift, and third-order fiber dispersion. J. D. Moores, W. S. Wong, and H. A. Haus, "Stability and Timing Maintenance in Soliton Transmission and Storage Rings", *Opt. Comm.*, 113, p. 153, (1994).

The Gordon-Haus effect is a noise-imparted propagation limitation which occurs when spontaneous emission noise from amplifiers shifts the frequency and thus, the velocity of an optical pulse through group velocity dispersion. These random velocity shifts result in timing errors. The timing errors limit the achievable bandwidth-transmission distance product. In optical memories, the Gordon practical storage time of the memory.

Raman self-frequency shift is another propagation imitation which occurs with short-pulse transmissions and is due to the fad that the pulse frequency shifts with propagation distance at a rate proportional to the squared pulse bandwidth and the intensity. Noise-imparted fluctuations in pulse photon number and pulse width alter the rate of Raman sell-frequency shift of a pulse, or equivalently, alter the rate at which the inverse group velocity changes with distance and result in additional timing errors. This Raman effect is a serious limitation for high-speed long-distance transmissions and long-term storage.

Third order dispersion also limits propagation and storage time. Classically, it leads to distortion of pulses, including solitons. Furthermore, noise-imparted fluctuations in pulse bandwidth result in timing jitter. Other effects which may limit propagation and storage time include electrostriction and inter-pulse interactions. P Researchers have discovered that these propagation limitations can be overcome by incorporating a stabilizing element in the circulating loop. This allows long-term storage without pulse degradation, timing jitter or photon number fluctuations. C. R. Doerr, W. S. Wong, H. A. Haus and E. P. Ippen, "Additive-Pulse Mode-locking/Limiting Storage Ring"; Opt. Lett., 19, p. 1747, (1994). Prior art stabilizing elements utilize electronic or electro-optic devices modulated by an electrical signal to control optical transmission within the circulating loop. The data rate in the circulating loop is limited by the bandwidth of the electronic or electro-optic devices. Unfortunately, the bandwidth of these devices limits the data rate in the circulating loop to around 10–20 GHz.

It is therefore a principal object of this invention to provide a circulating loop memory in which the stabilizing element is all-optical and, therefore, is not limited by the bandwidth of electronic or electro optic devices. It is another object of this invention to provide an all-optical stabilizing element that utilizes known ultrafast optical transmission nonlinearities of semiconductor amplifier devices. Such a stabilizing element allows the storage of a high-speed optical data pattern for long periods of time. It is another object of this invention to provide a monolithically integrated all-optical memory suitable for a compact optical communication system. It is another object of this invention to provide an optical pattern generator for producing high-speed optical random and pseudo-random signals.

SUMMARY OF THE INVENTION

A principle discovery of the present invention is that an optical memory and an optical random and pseudo-random pattern generator can be constructed with an all-optical stabilizing element that utilizes known ultrafast optical transmission nonlinearities of semiconductors. These nonlinearities include carrier-density-induced absorption saturation, carrier-density-induced gain saturation, spectral hole burning, carrier heating, and two-photon absorption.

Because the memory is all-optical, the data rate is not limited to the bandwidth of electronic or electro-optic devices. Data rates in an optical loop with all-optical stabilization can exceed 100 GHz. Such a memory element is advantageous for optical communications, where optical control signals are already present or easily generated and where electrical control signals may require additional hardware.

Accordingly, the present invention features an optical memory and an optical random and pseudo-random pattern generator which incorporates optical amplitude modulation for timing stability and nonlinear polarization rotation for bistability. In one embodiment, an optical memory includes an optical ring resonator having a circulating optical path for sustaining a data stream comprising high and low intensity optical signals. The resonator may include at least three reflecting members, a length of optical fiber that closes back onto itself to form a loop, or a monolithically integrated optical waveguide that closes back onto itself to form a loop.

An optical alter may be disposed within the optical path for optical stability and wavelength selection. A dispersion element may be disposed within the optical path for controlling total dispersion in the optical path in the ring resonator. A unidirectional element may be disposed within the optical path for restricting the direction of propagation of the optical signals.

An optical amplifier is disposed in the optical path of the ring resonator for amplifying the optical signals. The optical amplifier may be a semiconductor amplifier or a fiber amplifier disposed in the optical path. The fiber amplifier may be any rare-earth doped fiber amplifier.

A bistability generator is also disposed in the optical path of the ring resonator. The bistability generator simultaneously provides lossless circulation in the optical path for the high intensity optical signals and net loss circulation for both the low intensity optical signals and any amplified spontaneous emission signals. The bistability generator may be an intensity-dependent loss element. The intensity-dependent loss element may include a polarization rotation generator for providing rotation proportional to intensity and a polarization selective element for selecting only a certain polarization. The polarization rotation generator may be an optical fiber, a bulk optic Kerr medium, or a semiconductor. In addition, the intensity-dependent loss element may include one or more polarization state controllers. The polarization selective element and the polarization state controllers are configured to control the intensity dependent loss.

An optically-controlled stabilizing element is also disposed in the optical path of the ring resonator for providing signal timing stability. The optically controlled stabilizing element also may determine the repetition rate for the data stream in the optical ring resonator and may compensate for timing jitter. Further, the optically-controlled stabilizing element may provide pulse width stability and signal amplitude stability. The optically controlled stabilizing element may be an amplitude-modulated, a phase-modulated, or a frequency-modulated transmission element. The transmission element may be a modulated semiconductor amplifier. The semiconductor amplifier may be modulated by cross-gain saturation, cross-phase modulation, or by four-wave mixing. Optical control for the stabilizing element may be provided by an optical signal generator, an optical pulse source, or an input data source.

The optical memory also includes a coupling element which communicates with the optical path for coupling signals out of the ring resonator. The coupling element may be an optical coupler or switch, which couples the optical signals out of the resonator. In addition, the coupling element may be an optical coupler or switch, which couples the optical signals into and out of the resonator. The coupling element may input optical signals from an optical data source into the ring resonator.

In another embodiment, an optical pattern generator includes an optical ring resonator, having a circulating optical path for sustaining a data stream comprising high and low intensity optical signals. The resonator may be constructed from at least three reflecting members, a length of optical fiber that doses back onto itself to form a loop, or a monolithically integrated optical waveguide that closes back onto itself to form a loop. An optical filter may be disposed within the optical path for optical stability and wavelength selection. A dispersion element may be disposed within the optical path for controlling total dispersion in the optical path in the ring resonator. A unidirectional element may be disposed within the optical path for restricting the direction of propagation of the optical signals.

An optical amplifier having spontaneous emission noise is disposed in the optical path of the ring resonator for amplifying the spontaneous emission noise to generate and sustain a data pattern. The optical amplifier may be a fiber amplifier disposed in the optical path. The fiber amplifier may be any rare-earth doped fiber amplifier. The amplifier may also be a semiconductor amplifier.

A bistability generator is also disposed in the optical path of the ring resonator, which simultaneously provides lossless circulation in the optical path for the high intensity optical signals and net loss circulation for both the low intensity optical signals and any amplified spontaneous emission signals. The bistability generator may be an intensity-dependent loss element. The intensity-dependent loss element may include a polarization rotation generator for providing rotation proportional to intensity and a polarization selective element for allowing only a certain polarization in the optical path. The polarization rotation generator may be an optical fiber, a bulk optic Kerr medium, or a semiconductor. In addition, the intensity-dependent loss element may include one or more polarization state controllers. The polarization selective element and the polarization state controllers are configured to control the intensity dependent loss.

An optically-controlled stabilizing element may be disposed in the optical path of the ring resonator for providing amplitude and pulse width signal timing stability. The optically-controlled stabilizing element also may determine the repetition rate for the data stream in the optical ring resonator and may compensate for timing jitter. Further, the optically-controlled stabilizing element may provide pulse width stability and signal amplitude stability. The optically-controlled stabilizing element may be an amplitude-modulated, a phase-modulated, or a frequency-modulated transmission element. The transmission element may be a semiconductor amplifier. The semiconductor amplifier may be modulated by cross-gain saturation, cross-phase modulation, or by four-wave mixing. Optical control for the stabilizing element may be provided by an optical signal generator, an optical pulse source, or an input data source.

The optical random pattern generator also includes a coupling element, which communicates with the optical path for coupling signals out of the ring resonator. The coupling element may be an optical coupler or a switch, which couples the optical signals out of the resonator. In addition, the coupling element may be an optical coupler or a switch, which couples the optical signals into and out of the resonator. The coupling element may input optical signals from an optical data source into the ring resonator.

In another embodiment, the optical pattern generator also includes a coupling element which communicates with the optical path and couples a predetermined data pattern into the ring resonator in order to seed the optical pattern generator. In this embodiment, the optical pattern generator includes an optical switch disposed in the optical path of the ring resonator for altering the data pattern.

In another embodiment, a monolithically integrated optical memory includes a ring resonator that is formed from an optical waveguide which is monolithically integrated into a substrate. The substrate may be a semiconductor or a lithium niobate substrate. The waveguide forms a circulating optical path for sustaining a data stream comprising high and low intensity optical signals. A unidirectional element may be monolithically integrated into the substrate so that it is disposed in the optical path of the ring resonator. The unidirectional element restricts the direction of the optical signals.

An optical amplifier for amplifying the optical signals is monolithically integrated into the substrate so that it is disposed in the optical path of the ring resonator. A bistability generator is monolithically integrated into the substrate so that it is disposed in the optical path of the ring resonator. The bistability generator simultaneously provides lossless circulation in the optical path for the high intensity optical signals and net loss circulation for both the low intensity optical signals and any amplified spontaneous emission signals. An optically-controlled stabilizing element is monolithically integrated into the substrate so that it is disposed in the optical path of the ring resonator. The stabilizing element provides timing signal stability.

A coupling element is monolithically integrated into the substrate so that it communicates with the optical path and couples the optical signals in and out of the ring resonator. The coupling element may be an optical coupler or a switch.

In another embodiment, an optical memory utilizes a single nonlinear element for generating optical amplification, bistability, and timing signal stability. The nonlinear element is disposed in the optical path of the ring resonator. The nonlinear element includes an amplifier for amplifying the optical signals, a bistability generator, and an optically controlled stabilizing element for providing timing signal stability.

BRIEF DESCRIPTION OF THE DRAWINGS

The foregoing and other objects, features and advantages of the invention will become apparent from the following more particular description of preferred embodiments of the invention, as illustrated in the accompanying drawings. The drawings are not necessarily to scale, emphasis instead being placed on illustrating the principles of the present invention.

DETAILED DESCRIPTION OF THE INVENTION

Figure 1:
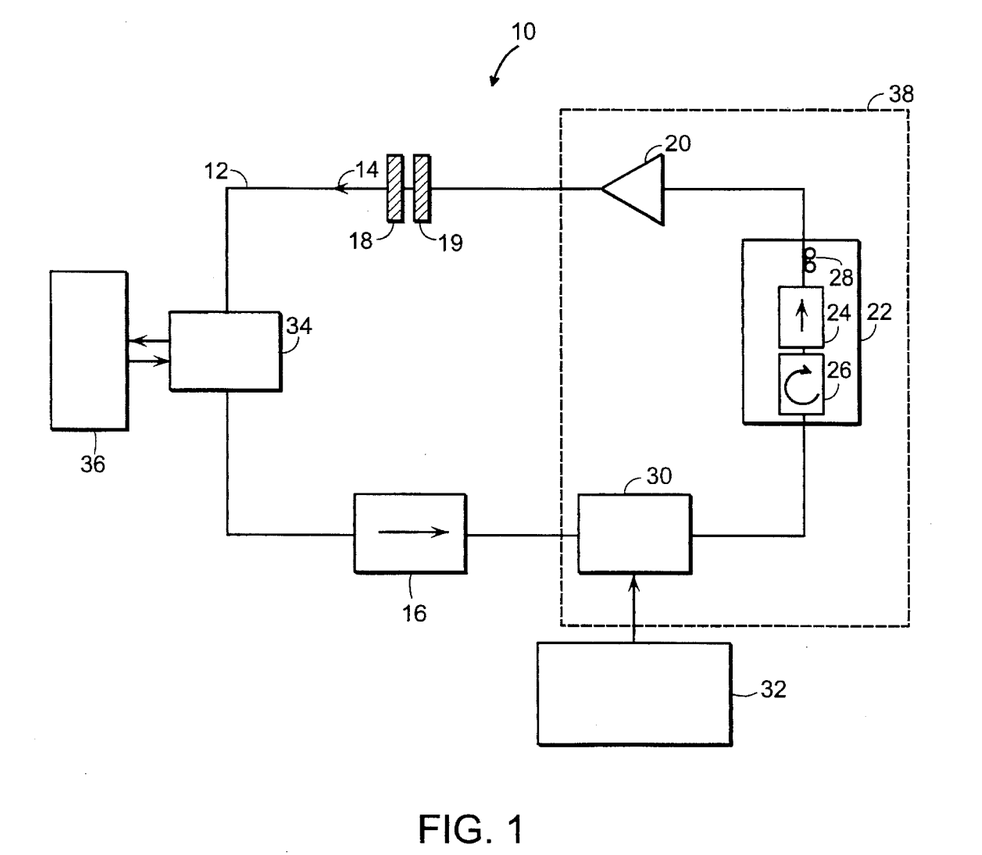
FIG. 1 is one embodiment of an optical memory which incorporates an optically-controlled stabilizing element.

FIG. 1 is one embodiment of an optical memory which incorporates an optically-controlled stabilizing element in accordance with the principles of the invention. An optical memory 10 is constructed from an optical ring resonator 12 having a circulating optical path 14 for sustaining a data stream comprising high and low intensity optical signals. The ring resonator 12 may be constructed from at least three reflecting members, a length of optical fiber that doses back onto itself to form a loop, or a monolithically integrated optical waveguide that closes back onto itself to form a loop. A unidirectional element 16 is disposed within the optical path 14 for restricting the direction of propagation of the optical signals. The unidirectional element 16 need not be a separate element it may be part of another element disposed in the optical path 14. An optical filter 18 may be disposed in the optical path for providing optical stability and wavelength selection. A dispersion element 19 may be disposed within the optical path 14 for controlling total dispersion in the ring resonator 12.

An optical amplifier 20 is disposed in the optical path 14 of the ring resonator 12 for amplifying the optical signals. The optical amplifier 20 may be a fiber amplifier or semiconductor amplifier. Any rare-earth doped fiber amplifier such as an erbium, praseodymium, ytterbium-erbium or thulium doped fiber amplifier may be used.

A bistability generator 22 is disposed in the optical path 14 of the ring resonator 12. The bistability generator 22 maintains the intensity of the pulses and reduces timing jitter. More specifically, the bistability generator 22 simultaneously provides lossless circulation in the optical path 14 for high intensity optical signals and net loss circulation for both low intensity optical signals and any amplified spontaneous emission signals. That is, low intensity optical signals are suppressed while high intensity signals see unity round-trip gain thus, forcing the high intensity signals to a fixed amplitude.

In one embodiment, the bistability generator 22 is an intensity-dependent loss element which comprises a polarization selective element 24 and a polarization rotation generator 26. The polarization selective element 24 passes only a certain polarization. The polarization rotation generator 26 provides nonlinear polarization rotation proportional to the intensity of the optical signals. The polarization rotation generator 26 may comprise materials such as optical fibers, bulk optic Kerr media, or semiconductors. In one embodiment, the polarization rotation generator 26 is an optical fiber comprising the optical ring resonator 12.

In addition, the bistability generator 22 may include one or more polarization state controllers 28 to adjust the polarization of the optical signal to an optimum polarization. The polarization selective element 24 together with the polarization state controllers 28 control the intensity dependent loss.

An optically-controlled stabilizing element 30 is disposed in the optical path 14 of the ring resonator 12. The optically controlled stabilizing element 30 may determine the repetition rate for the data stream in the optical ring resonator 12 and may compensate for timing jitter. Further, the optically controlled stabilizing element may provide pulse width stability and signal amplitude stability.

The optically controlled stabilizing element 30 may be an amplitude-modulated, a phase-modulated, or a frequency-modulated transmission element. The transmission element may be a modulated semiconductor amplifier. Semiconductor transmission elements are advantageous because semiconductors exhibit known ultrafast optical transmission nonlinearities. These nonlinearities cause transmission changes due to optical control signals in the amplifier. For example, carrier-density-induced absorption saturation occurs in semiconductors when a semiconductor amplifier is biased in the absorption regime. Carrier-density-induced gain saturation occurs in semiconductors when a semiconductor amplifier is biased in the gain regime. Spectral hole burning may also occur in semiconductors which increases transmission during absorption and decreases transmission during gain. Carrier heating occurs in semiconductors and reduces the transmission during both absorption and gain. Also, two-photon absorption occurs in semiconductors and reduces transmission.

An optical signal generator 32 modulates the stabilizing element 30. Modulation of the optically-controlled stabilizing element 30 can be achieved by numerous mechanisms including cross-gain saturation, cross-phase modulation, and four-wave mixing. The optical signal generator 32 may be an optical signal generator, an optical pulse source, or an input data source.

The optical memory includes a coupling element 34 which communicates with the optical path 14 for coupling signals out of the ring resonator 12. The coupling element may be a coupler or a switch which couples the optical signals out of the ring resonator 12. The coupling element may be an optical coupler or a 1×2 switch. In addition, the coupling element 34 may be a coupler or a switch which couples the optical signals into and out of the resonator. The coupling element may be an optical coupler or a 2×2 switch. In addition, the coupling element 34 may input optical signals from an optical data source 36 into the ring resonator 12.

In another embodiment of the present invention, a single nonlinear element 38 is utilized to generate optical amplification, bistability, and timing signal stability. The nonlinear element 38 is disposed in the optical path 14 of the ring resonator 12. The nonlinear element 38 includes the optical amplifier 20 for amplifying the optical signals, a bistability generator 22, and an optically controlled stabilizing element 30 for providing timing signal stability.

Figure 2:
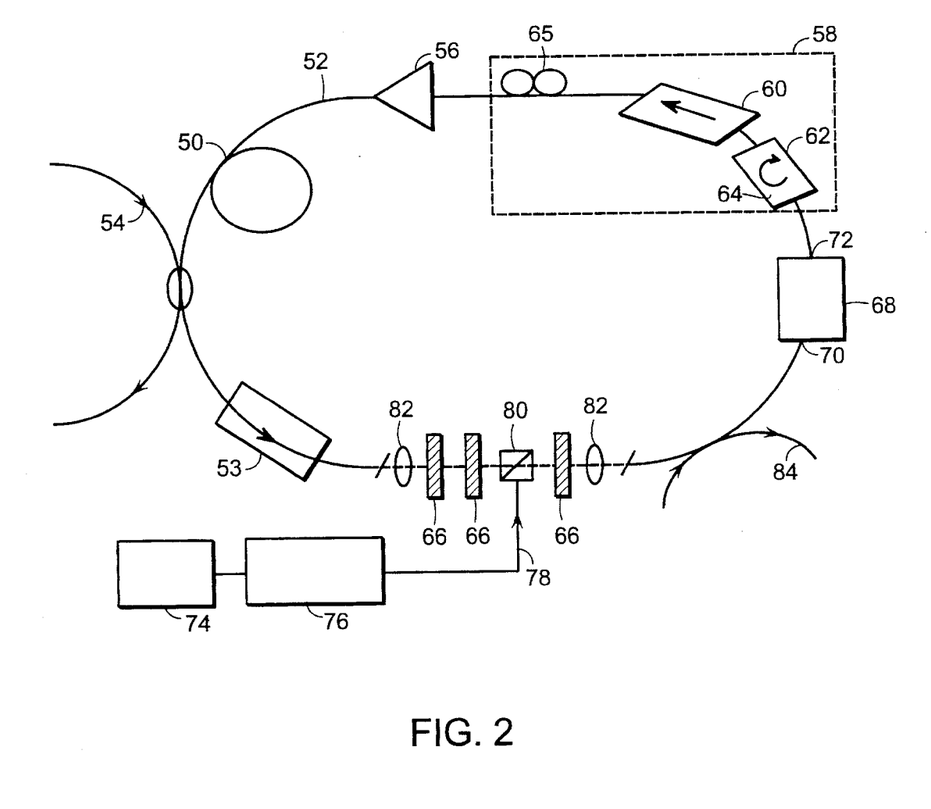
FIG. 2 is another embodiment of an optical memory which incorporates an all-optical stabilizing element wherein the ring resonator comprises an optical fiber that closes back onto itself to form a loop.

FIG. 2 is another embodiment of an optical memory, featuring an all-optical stabilizing element. A ring resonator comprises an optical fiber 50 configured to form a closed fiber loop 52 of a fixed length which defines a fundamental cavity frequency. The fiber 50 may be single mode fiber such as SMF-28 fiber. A polarization-sensitive isolator 53 disposed in the loop 52 restricts propagation of optical signals in the fiber 50 to one direction. A coupler 54 communicating with the loop 52 is utilized to couple a portion of the optical signals propagating in the fiber out of the fiber 50. The coupler 54 may also be utilized to couple optical signals into the fiber 50.

A fiber amplifier 56 disposed in the loop 52 is used to amplify optical signals propagating in the loop 52. The fiber amplifier 56 may comprise a highly-doped rare-earth fiber and a pump laser coupled to the doped rare-earth fiber by a wavelength division multiplying coupler (not shown). Examples of rare-earth doped fibers are erbium, praseodymium, ytterbium-erbium or thulium doped fiber. For example, an erbium-doped fiber amplifier may be pumped by a master oscillator power amplifier (MOPA) at 980 nm.

The optical memory includes a bistability generator 58 disposed in the loop 52 for providing intensity-dependent loss. The bistability generator 58 comprises a polarization selective element 60 and a polarization rotation generator 62 disposed in the loop 52. The polarization selective element 60 allows only a certain polarization in the fiber 50. The polarization rotation generator 62 utilizes a portion of the optical fiber 64 to achieve polarization rotation proportional to intensity. Alternatively, the entire optical fiber 50 may be used to achieve polarization rotation proportional to intensity. In addition, the bistability generator 58 includes one or more polarization controllers 65 which control the polarization states of the optical signals in the fiber 50. Waveplates 66 disposed in the loop 52 may also be used to control the polarization states of the optical signals in the fiber 50.

An optically-controlled stabilizing element 68 is disposed in the loop 52. The stabilizing element 68 is a semiconductor amplifier. The semiconductor amplifier may be a commercially available high-power laser diode with antireflection coating on both facets 70,72. Coupling into and out of the laser amplifier may be achieved by fiber microlenses (not shown).

A control laser 74 and a modulator 76 are utilized to control the stabilizing element 68. The control laser 74 generates an optical control beam 78 and the modulator 76 amplitude modulates the optical beam 78 to create a modulated control beam. The control laser 74 may be a semiconductor diode laser. The modulator may be a LiNbO$_3$ amplitude modulator.

The optical control beam 78 may be coupled to the fiber 50 by a polarization beamsplitting cube 80 and lenses 82. A fiber coupler (not shown) may be used instead of the beamsplitting cube 80 and lenses 82. A typical optical power for achieving cross-saturation in the semiconductor amplifier is approximately 1 mW. The control beam 78 may be coupled out of the fiber 50 by a wavelength division multiplexing coupler 84 or may be absorbed in the fiber amplifier 56.

The use of the control laser 74 and the amplitude modulator 76 to cross-saturate the gain of the semiconductor amplifier is advantageous because it allows high data rates without the use of a short pulse laser source. Optical signals that are modulated are potentially easier to generate, and more widely tunable in rate and in frequency, than are signals generated by modelocked sources. In addition, optical signals may simplify the access node design because the incoming optical clock or data stream could be used to synchronize the optical memory to the network data rate.

An all-optical memory incorporating the the control laser 74 and the amplitude modulator 6 to cross-saturate the gain of the semiconductor amplifier for timing stability has achieved storage of a 1.25 kbit packet at 10 Gb/s with a data pattern spontaneously generated from noise. The gain was modulated optically at rates exceeding 10 GHz. Modulation rates may be extended to the 100 GHz range by using soliton optical modulation sources, and by taking advantage of enhanced recovery rates and high-speed nonlinearities, such as carrier heating in the diode amplifiers.

Figure 3:
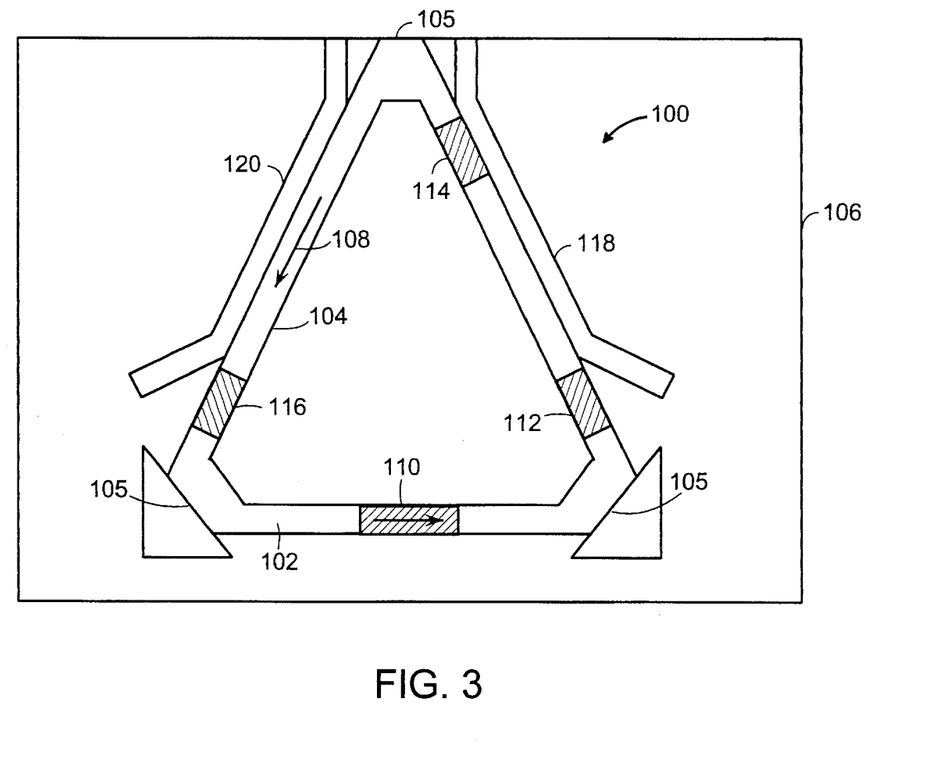
FIG. 3 is another embodiment of the present invention which is a monolithically integrated optical memory.

Another embodiment of the present invention is a monolithically integrated optical memory shown in FIG. 3. Such a device is advantageous because it is potentially much smaller in size and is directly compatible with other integrated optical devices. The monolithically integrated optical memory 100 has a ring resonator 102 formed from an optical wave guide 104 and mirrors 105 which are monolithically integrated into a substrate 106. The substrate 106 may be a semiconductor or a lithium niobate substrate. The waveguide 104 forms a circulating optical path 108 for sustaining a data stream comprising high and low intensity optical signals. A unidirectional element 110 is monolithically integrated into the substrate 106 so that it is disposed in the optical path 108 of the ring resonator 102. The unidirectional element 110 restricts the direction of the optical signals.

An optical amplifier 112 for amplifying the optical signals is monolithically integrated into the substrate 106 so that it is disposed in the optical path 108 of the ring resonator 102. A bistability generator 114 is monolithically integrated into the substrate 106 so that it is disposed in the optical path 108 of the ring resonator 102. The bistability generator 114 simultaneously provides lossless circulation in the optical path 108 for the high intensity optical signals and net loss circulation for both the low intensity optical signals and any amplified spontaneous emission signals.

An optically controlled stabilizing element 116 is monolithically integrated into the substrate 106 so that it is disposed in the optical path 108 of the ring resonator 102. The stabilizing element 116 provides timing signal stability. The stabilizing element 116 may be a semiconductor amplifier. An optical signal generator (not shown) for modulating the stabilizing element 116 is coupled to the stabilizing element 116 by a coupler 120. Modulation of the optically-controlled stabilizing element 116 can be achieved by numerous mechanisms including cross-gain saturation, cross-phase modulation, and four-wave mixing. The optical signal generator may be an optical signal generator, an optical pulse source, or an input data source A coupling element 118 is monolithically integrated into the substrate 106 50 that it communicates with the optical path 108 and couples the optical signals in and out of the ring resonator 102. The coupling element may be an optical coupler or a switch that is monolithically integrated into the substrate 106.

Figure 4:
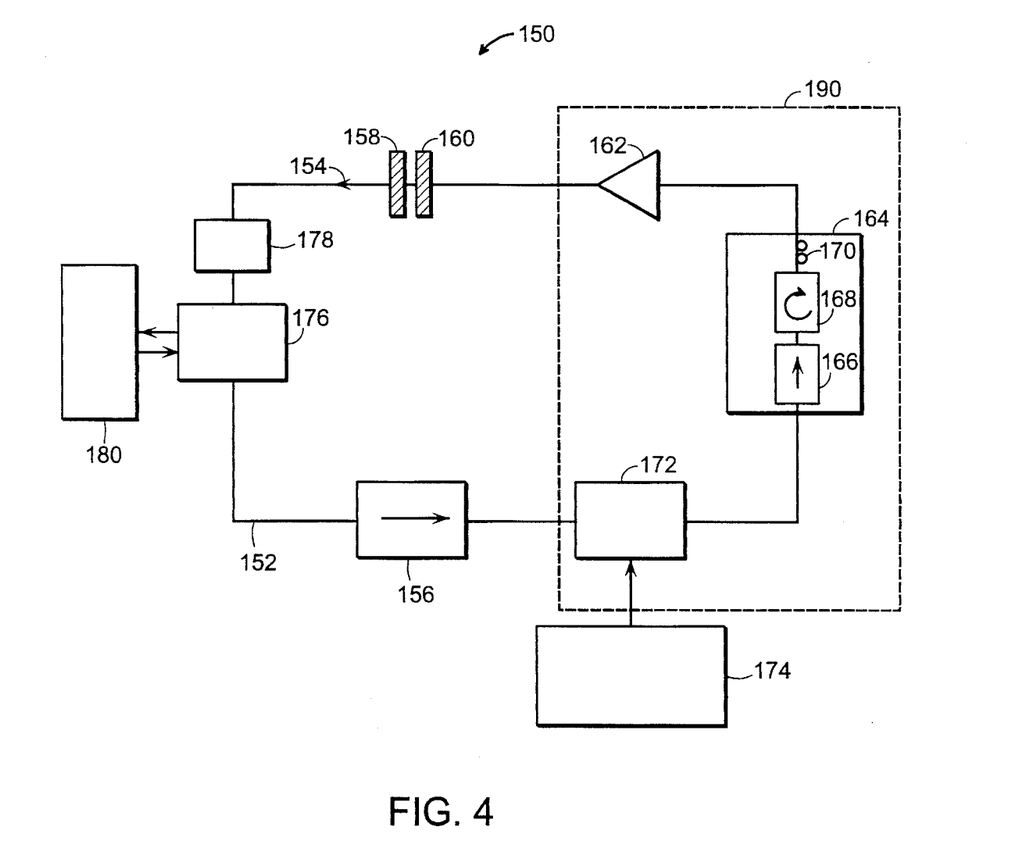
FIG. 4 is one embodiment of an optical random pattern generator which generates random or pseudo-random optical signals from noise.

FIG. 4 is one embodiment of an optical pattern generator which generates random optical signals from noise. An optical pattern generator 150 is constructed from an optical ring resonator 152 having a circulating optical path 154 for sustaining a data stream comprising high and low intensity optical signals. The ring resonator 152 may be constructed from at least three reflecting members, a length of optical fiber that closes back onto itself to form a loop, or a monolithically integrated optical waveguide that closes back onto itself to form a loop. A unidirectional element 156 is disposed within the optical path 154 for restricting the direction of propagation of the optical signals. An optical filter 158 is disposed within the optical path for optical stability and wavelength selection. A dispersion element 160 is disposed within the optical path 154 for controlling total dispersion in the ring resonator 152.

An optical amplifier 162 having spontaneous emission noise is disposed in the optical path 154 of the ring resonator 152 for amplifying the spontaneous emission noise to generate the data pattern. The optical amplifier 162 may be a fiber amplifier (not shown) disposed in the optical path 154. The fiber amplifier may be any rare-earth doped fiber amplifier such as an erbium, praseodymium, ytterbium-erbium or thulium doped fiber amplifier. The optical amplifier 162 may also be a semiconductor amplifier.

A bistability generator 164 is also disposed in the optical path 154 of the ring resonator 152. As described in connection with FIG. 1, the bistability generator maintains the intensity of optical pulses circulating in the ring resonator 152 and reduces timing jitter. The bistability generator 164 simultaneously provides lossless circulation in the optical path 154 for high intensity optical signals and net loss circulation for both low intensity optical signals and any amplified spontaneous emission signals.

In one embodiment, the bistability generator 164 is an intensity-dependent loss element which comprises a polarization selective element 166 and a polarization rotation generator 168. The polarization selective element 166 allows only a certain polarization in the optical path 154. The polarization rotation generator 168 provides nonlinear polarization rotation proportional to the intensity of the optical signals. The polarization rotation generator 168 may comprise materials such as optical fibers, bulk optic Kerr media, or semiconductors.

In addition, the bistability generator 164 may include one or more polarization state controllers 170 to adjust the polarization of the optical signal to an optimum polarization. The polarization selective element 166 together with the polarization state controllers 170 control the intensity-dependent loss.

An optically controlled stabilizing element 172 may be disposed in the optical path 154 of the ring resonator 152. The optically-controlled stabilizing element 172 may determine the repetition rate for the data stream in the optical ring resonator 152 and may compensate for timing jitter. Further, the optically controlled stabilizing element may provide pulse width stability and signal amplitude stability.

The optically-controlled stabilizing element 172 may be an amplitude-modulated, a phase-modulated, or a frequency-modulated transmission element. The transmission element may be a modulated semiconductor amplifier. As described in connection with FIG. 1, semiconductor transmission elements are advantageous because semiconductors exhibit known ultrafast optical transmission nonlinearities.

Modulation of the optically-controlled stabilizing element 172 can be achieved by numerous techniques including cross-gain saturation, cross-phase modulation and four-wave mixing. An optical signal generator 174 provides optical control for the stabilizing element 172. The optical signal generator 174 may be an optical signal generator, an optical pulse source, or an input data source.

The optical memory includes a coupling element 176 which communicates with the optical path 154 for coupling generated optical patterns into and out of the ring resonator 152. The coupling element 176 may be a coupler or a switch which couples the optical signals out of the ring resonator 152. The coupling element 176 may be an optical coupler, a 1×2 switch or a 2×2 switch.

The present invention also features an optical pattern generator for generating pseudo-random optical signals from noise. The pattern generator includes an optical ring resonator, an optical amplifier, and a bistability generator which corresponds to the pattern generator described in connection with FIG. 4. In addition, the coupling element 176 couples a predetermined data pattern into the ring resonator 152 in order to seed the pattern generator. The pattern generator may also include an optical switch 178 disposed in the optical path of the ring resonator for altering the data pattern.

The coupling element 176 be a coupler or a switch which couples the optical signals into and out of the ring resonator 152. The coupling element 176 may be an optical coupler or a 2×2 switch. In addition, the coupling element 176 may input optical signals from an optical data source 180 into the ring resonator 152.

In another embodiment of the present invention, a single nonlinear element 190 is utilized to generated optical amplification, bistability, and timing signal stability. The nonlinear element 190 is disposed in the optical path 154 of the ring resonator 152. The nonlinear element 190 includes the optical amplifier 162 for amplifying the optical signals, a bistability generator 164, and an optically-controlled stabilizing element 172 for providing timing signal stability.

Figure 5:
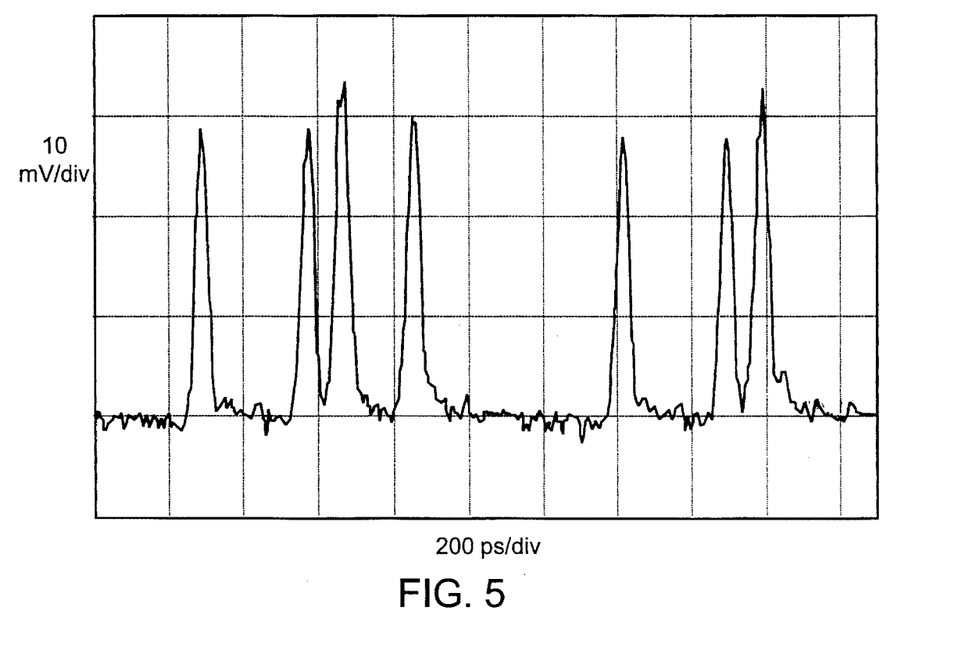
FIG. 5 illustrates storage of a data pattern generated from noise in a ring resonator similar to FIG. 4.

FIG. 5 illustrates storage of data pattern generated from noise in a ring resonator similar to the configuration shown in FIG. 2 and FIG. 4. The displayed dab pattern is 21 bits long which corresponds to a 2 ns time window. The data rate is 10.6 GHz. The data were detected by a 45 GHz bandwidth photodiode and were displayed on a digital sampling oscilloscope with a 50 GHz bandwidth. The oscilloscope was triggered at the fundamental cavity frequency of the ring resonator. The density of ONE bits in the data pattern is a function of the average gain in the closed fiber loop and the polarization bias of the fiber. The data patterns were stored for several minutes. Unlike prior art optical memories, the storage time is not limited.

Figure 6:
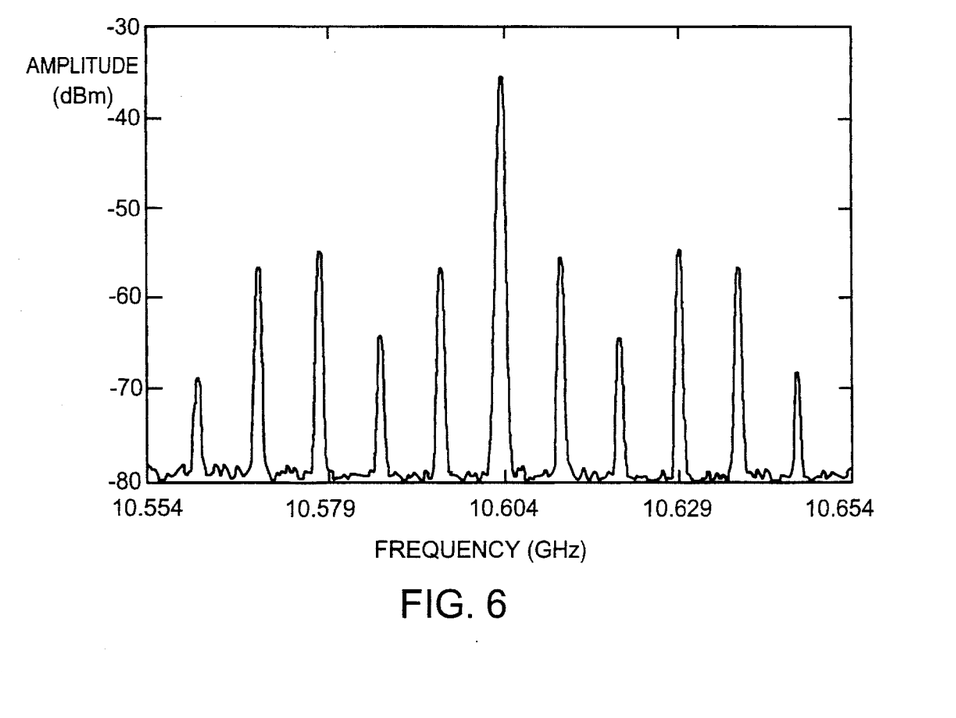
FIG. 6 illustrates a portion of the measured R.F. spectrum for a stored pseudo-random word generated by a ring resonator similar to FIG. 4.

FIG. 6 shows a portion of the measured R.F. spectrum for a stored pseudo-random word. The portion is centered at 10.6 GHz and has a total span of 100 MHz. The observed sidebands are spaced by the period of the cavity round-trip and are constant while the data pattern is stored. Storage of higher data rates can be achieved by optimizing the loop parameters such as, total dispersion in the loop given the optical data rate and the average power and the optical amplifier bias points and recovery rates.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims. For example, although a particular placement of components in the optical path is illustrated in FIGS. 1–4, it is noted that other placements of components may be used without departing from the spirit and scope of the invention.

What is claimed is:

1. An optical memory comprising:
   a) an optical ring resonator having a circulating optical path for sustaining a data stream comprising high and low intensity optical signals;
   b) an optical amplifier disposed in the optical path of the ring resonator for amplifying the optical signals;
   c) a bistability generator disposed in the optical path of the ring resonator which simultaneously provides lossless circulation in the optical path for the high intensity optical signals and net loss circulation for both the low intensity optical signals and any amplified spontaneous emission signals;
   d) an optically-controlled stabilizing element disposed in the optical path of the ring resonator for providing signal timing stability; and
   e) a coupling element in communication with the optical path for coupling signals in and out of the ring resonator.

2. The optical memory of claim 1 wherein the ring resonator comprises an optical fiber loop or at least three reflecting members that form a loop.

3. The optical memory of claim 1 wherein the optical amplifier is a fiber amplifier or a semiconductor amplifier.

4. The optical memory of claim 1 wherein the bistability generator is an intensity-dependent loss element comprising:
   a) a polarization rotation generator that provides rotation proportional to intensity; and
   b) a polarization selective element.

5. The optical memory of claim 4 wherein the polarization rotation generator is an optical fiber, a bulk optic Kerr medium, or a semiconductor.

6. The optical memory of claim 4 further comprising one or more polarization state controllers.

7. The optical memory of claim 1 wherein the optically-controlled stabilizing element comprises an amplitude-modulated transmission element.

8. The optical memory of claim 7 wherein the amplitude-modulated transmission element is a semiconductor amplifier and the semiconductor amplifier is modulated by cross-gain saturation, cross-phase modulation, or by four-wave mixing.

9. The optical memory of claim 1 wherein the optically-controlled stabilizing element comprises a phase-modulated transmission element.

10. The optical memory of claim 1 wherein the optically-controlled stabilizing element comprises a frequency-modulated transmission element.

11. The optical memory of claim 1 further comprising an optical signal generator for optically controlling the stabilizing element.

12. The optical memory of claim 1 further comprising an optical filter positioned within the optical path for optical stability and wavelength selection.

13. The optical memory of claim 1 further comprising a dispersion element positioned within the optical path for controlling total dispersion in the ring resonator.

14. The optical memory of claim 1 wherein the coupling element is an optical coupler which couples the optical signals into and out of the resonator.

15. The optical memory of claim 1 wherein the coupling element is a switch which couples the optical signals into and out of the ring resonator.

16. The optical memory of claim 1 further comprising a unidirectional element positioned in the optical path for restricting the direction of propagation of the optical signals.

17. A monolithically integrated optical memory comprising:
   a) an optical waveguide monolithically integrated into a substrate to form a ring resonator having a circulating optical path for sustaining a data stream comprising high and low intensity optical signals;
   b) an optical amplifier monolithically integrated into the substrate and disposed in the optical path of the ring resonator for amplifying the optical signals;
   c) a bistability generator monolithically integrated into the substrate and disposed in the optical path of the ring resonator which simultaneously provides lossless circulation in the optical path for the high intensity optical signals and net loss circulation for both the low intensity optical signals and any amplified spontaneous emission signals;
   d) a coupling element monolithically integrated into the substrate and communicating with the optical path for coupling signals in and out of the ring resonator for outputting data; and
   e) an optically-controlled stabilizing element monolithically integrated into the substrate for providing timing signal stability.

18. The optical memory of claim 17 wherein the coupling element is an optical coupler.

19. The optical memory of claim 17 wherein the coupling element is a switch monolithically integrated into the substrate which couples the optical signals in and out of the ring resonator.

20. The optical memory of claim 17 wherein the substrate is a semiconductor or a lithium niobate substrate.

21. An optical memory comprising:

a) an optical ring resonator having a circulating optical path for sustaining a data stream comprising high and low intensity optical signals;
b) a nonlinear element comprising:
  i) an optical amplifier disposed in the optical path of the ring resonator for amplifying the optical signals;
  ii) a bistability generator disposed in the optical path of the ring resonator which simultaneously provides lossless circulation in the optical path for both the high intensity optical signals and net loss circulation for the low intensity optical signals and any amplified spontaneous emission signals; and
  iii) an optically-controlled stabilizing element disposed in the optical path of the ring resonator for providing timing signal stability; and
c) a coupling element communicating with the optical path for coupling signals in and out of the ring resonator for inputting and outputting data.

22. A optical random pattern generator comprising:
a) an optical ring resonator having a circulating optical path for sustaining a data pattern comprising high and low intensity optical signals;
b) an optical amplifier having spontaneous emission noise and positioned in the optical path of the ring resonator, wherein the amplifier amplifies the spontaneous emission noise to generate the data pattern;
c) a bistability generator disposed in the optical path of the ring resonator which simultaneously provides lossless circulation in the optical path for the high intensity optical signals and net loss circulation for both the low intensity optical signals and any amplified spontaneous emission signals; and
d) a coupling element communicating with the optical path for coupling the data pattern out of the ring resonator.

23. The optical random pattern generator of claim 22 wherein the ring resonator comprises an optical fiber or at least three reflecting members that form a loop.

24. The optical random pattern generator of claim 22 wherein the optical amplifier is a fiber amplifier or a semiconductor amplifier.

25. The optical random pattern generator of claim 22 wherein the bistability generator is an intensity-dependent loss element comprising:
a) a polarization rotation generator that provides rotation proportional to intensity; and
b) a polarization selective element.

26. The optical random pattern generator of claim 25 wherein the polarization rotation generator is an optical fiber, a bulk optic Kerr medium, or a semiconductor.

27. The optical random pattern generator of claim 25 further comprising one or more polarization state controllers.

28. The optical random pattern generator of claim 22 further comprising an optically-controlled stabilizing element disposed in the optical path of the ring resonator for providing signal stability.

29. The optical random pattern generator of claim 28 wherein the optically-controlled stabilizing element comprises an amplitude-modulated transmission element.

30. The optical random pattern generator of claim 29 wherein the transmission element is a semiconductor amplifier modulated by cross-gain saturation, cross-phase modulation, or by four-wave mixing.

31. The optical random pattern generator of claim 28 wherein the optically-controlled stabilizing element comprises a phase-modulated transmission element.

32. The optical random pattern generator of claim 28 wherein the optically-controlled stabilizing element comprises a frequency-modulated transmission element.

33. The optical random pattern generator of claim 28 further comprising an optical signal generator for providing optical control for the stabilizing element.

34. The optical random pattern generator of claim 22 wherein the coupling element is an optical coupler which couples the optical signals out of the resonator.

35. The optical random pattern generator of claim 22 wherein the coupling element is a switch which couples the optical signals out of the ring resonator.

36. An optical pseudo-random pattern generator comprising:
a) an optical ring resonator having a circulating optical path for sustaining a data pattern comprising high and low intensity optical signals;
b) an optical amplifier having spontaneous emission noise, disposed in the optical path of the ring resonator, wherein the amplifier amplifies the spontaneous emission noise to generate the data pattern;
c) a bistability generator disposed in the optical path of the ring resonator which simultaneously provides lossless circulation in the optical path for the high intensity optical signals and net loss circulation for both the low intensity optical signals and any amplified spontaneous emission signals; and
d) a coupling element communicating with the optical path for coupling a predetermined data pattern into the ring resonator and for coupling a generated optical pseudo-random pattern out of the ring resonator.

37. The optical pseudo-random pattern generator of claim 36 further comprising an optically-controlled stabilizing element disposed in the optical path of the ring resonator for providing signal stability.

38. The optical pseudo-random pattern generator of claim 37 wherein the optically-controlled stabilizing element comprises an amplitude-modulated transmission element.

39. The optical pseudo-random pattern generator of claim 38 wherein the transmission element is a semiconductor amplifier and the semiconductor amplifier is modulated by cross-gain saturation, cross-phase modulation, or by four-wave mixing.

40. The optical pseudo-random pattern generator of claim 36 further comprising an optical switch disposed in the optical path of the ring resonator for altering the data pattern.

* * * * *